(12) United States Patent
Kawano

(10) Patent No.: US 6,504,177 B2
(45) Date of Patent: Jan. 7, 2003

(54) OPTICAL ELEMENT MODULE

(75) Inventor: Minoru Kawano, Tokyo (JP)

(73) Assignee: Mitsubishi Denki Kabushiki Kaisha, Chiyoda-ku (JP)

( * ) Notice: Subject to any disclaimer, the term of this patent is extended or adjusted under 35 U.S.C. 154(b) by 34 days.

(21) Appl. No.: 09/848,323

(22) Filed: May 4, 2001

(65) Prior Publication Data

US 2002/0056843 A1 May 16, 2002

(30) Foreign Application Priority Data

Nov. 10, 2000 (JP) ......................................... 2000-342946

(51) Int. Cl.⁷ ...................... H01L 33/00; H01L 31/0232
(52) U.S. Cl. .............................. 257/81; 257/80; 257/98; 257/99; 257/432
(58) Field of Search .......................... 257/80, 432, 466, 257/81, 82, 98, 99; 438/48

(56) References Cited

U.S. PATENT DOCUMENTS

| | | | |
|---|---|---|---|
| 5,347,604 A | * 9/1994 | Go et al. | ........................ 385/90 |
| 5,717,803 A | * 2/1998 | Yoneda et al. | ................. 385/83 |
| 6,021,149 A | 2/2000 | Miyazaki et al. | |
| 6,134,371 A | * 10/2000 | Yoshida et al. | .............. 385/137 |
| 6,236,477 B1 | * 5/2001 | Ishihara et al. | .............. 359/618 |
| 6,246,097 B1 | * 6/2001 | Kato et al. | .................... 257/432 |
| 6,328,485 B1 | * 12/2001 | Hotta | ............................ 385/94 |
| 6,377,385 B1 | * 4/2002 | Saito | ............................ 359/248 |
| 2002/0001870 A1 | * 1/2002 | Oda et al. | ....................... 438/48 |
| 2002/0056843 A1 | * 5/2002 | Kawano | ........................ 257/80 |

FOREIGN PATENT DOCUMENTS

| | | |
|---|---|---|
| DE | 3737251 C2 | 5/1989 |
| DE | 4343494 A1 | 6/1995 |
| DE | 19527026 C2 | 2/1997 |
| DE | 19719853 A1 | 11/1998 |
| EP | 0550996 A1 | 7/1993 |
| JP | 8-78657 | 3/1996 |
| JP | 10-275957 | 10/1998 |
| JP | 2000-106468 A | 4/2000 |

* cited by examiner

Primary Examiner—Michael S. Lebentritt
(74) Attorney, Agent, or Firm—Burns, Doane, Swecker & Mathis, LLP

(57) ABSTRACT

A transmission line member is constituted as a mirostrip line comprising a conductor line formed on a top surface and a conductor layer formed over an entire back surface. A high frequency signal input to an electrode of a package is transmitted via a bonding wire, the transmission line member, and a bonding wire, to an electrode of a semiconductor laser. As dielectric loss is slight, the transmission line member can transmit a high frequency signal with little loss, thereby improving the high frequency characteristics of a signal to be input to the semiconductor laser.

17 Claims, 6 Drawing Sheets

OPTICAL ELEMENT MODULE

BACKGROUND OF THE INVENTION

1. Field of the Invention

The present invention relates to an optical element module comprising at least one optical element and a mounting substrate composed of a semiconductor or dielectric material, in which said optical element is mounted on a top surface thereof.

2. Description of Related Art

Optical element modules in which a semiconductor laser and an optical fiber are mounted on a silicon substrate using a passive alignment technique have been conventionally proposed. The passive alignment technique, in which the optical fiber is embedded in a V-shaped groove formed on the surface of the silicon substrate and the semiconductor laser is mounted at a predetermined position, allows the optical fiber and the semiconductor laser to be fixed at respective predetermined positions without adjusting the optical axes. In an optical element module thus configured, an electrode of the semiconductor laser is electrically connected to an electrode layer formed on the silicon substrate, so that an electrical signal is input to the semiconductor laser via this electrode layer. Such a configuration, however, is disadvantageous in that high frequency characteristics of a signal to be input to the semiconductor laser are lowered due to a high dielectric loss of the silicon substrate.

SUMMARY OF THE INVENTION

An optical element module in accordance with one aspect of the present invention aims to improve high frequency characteristics of a signal to be input into an optical element, and comprises an optical element; a mounting substrate composed of a semiconductor or dielectric material and supporting said optical element on a top surface; and a transmission line member at least partially mounted on the top surface of said mounting substrate and electrically connected with said optical element.

The above optical element module, in which electrical connection with the optical element is achieved through the transmission line member, can improve high frequency characteristics even when the mounting substrate is composed of a semiconductor or dielectric material.

In the above optical element module, said mounting substrate may have a groove on the top surface, and at least a part of said transmission line member may be mounted on a bottom surface of said groove. In this optical element module, said groove may be formed as a cut out portion which is removed from a side surface of said mounting substrate. Also, said groove may be formed such that the height of said optical element at a top surface is substantially the same as the height of said transmission line member at a top surface.

The optical element module according to the above aspect may further comprise a connecting member for electrically and physically connecting said optical element and said transmission line member on the side of the top surface of said optical element. Thus, inductance components of the connecting member can be reduced, thereby further improving the high frequency characteristics of the optical element module.

In the above optical element module having a groove on the top surface, said groove may be formed such that the bottom surface thereof and said transmission line member are of substantially the same width. This facilitates positioning of the transmission line member with regard to the bottom surface of the groove. Further, said mounting substrate may comprise a bottom electrode formed at the bottom surface of said groove.

In the above optical element module, said transmission line member comprises a conductor layer formed on substantially the entire back surface of said transmission line member for supplying a ground potential to said optical element via said bottom electrode, and a conductor line formed on the top surface of said transmission line member for transmitting a signal to said optical element. Since a ground potential is thus supplied to the conductor layer and the bottom electrode, a variation in the ground potential is small even when a high frequency signal is input to the optical element. This leads to further improvement of the high frequency characteristics of the optical element module.

In the above-described optical element module having a groove formed on the top surface, said mounting substrate may be provided with a bottom electrode extending through the back surface and a side surface of the substrate to the bottom of said groove. Due to the thus-increased area of the bottom electrode, the high frequency characteristics can be further improved. Further, said mounting substrate may also be provided with a bottom electrode extending through the back surface and a side surface of the substrate having a beveled corner to the bottom of said groove. Because the corner of the side surface of the substrate is beveled, peeling of the bottom electrode off of the groove bottom can be prevented.

The above optical element module may comprise a resin sealing member for sealing said optical element, said mounting substrate, and said transmission line member. This leads to further improvement of the high frequency characteristics.

Further, in the above optical element module, said optical element may be a semiconductor laser or a semiconductor laser comprising a modulator. Also, said mounting substrate may be made of silicon. In addition, the above optical element module may comprise an optical fiber receiving light emitted from said optical element, or an optical fiber which is mounted on a V-shaped groove formed on the top surface of said mounting substrate and receives light emitted from said optical element.

An optical element module in accordance with a second aspect of the present invention comprises an optical element; a mounting substrate composed of a semiconductor or dielectric material and supporting said optical element on a top surface, said mounting substrate having a plurality of grooves formed on said top surface; and a plurality of transmission line members at least partially mounted on a bottom surface of any of said plurality of grooves and electrically connected with said optical element.

With the above-described optical element module, the high frequency characteristics can be improved when a plurality of transmission line members are necessary.

BRIEF DESCRIPTION OF THE DRAWINGS

These and other objects of the invention will be explained in the description below, in connection with the accompanying drawings, in which.

DETAILED DESCRIPTION OF THE PREFERRED EMBODIMENT

A preferred embodiment of the present invention will be described in further detail with reference to the accompanying drawings.

Figure 1:
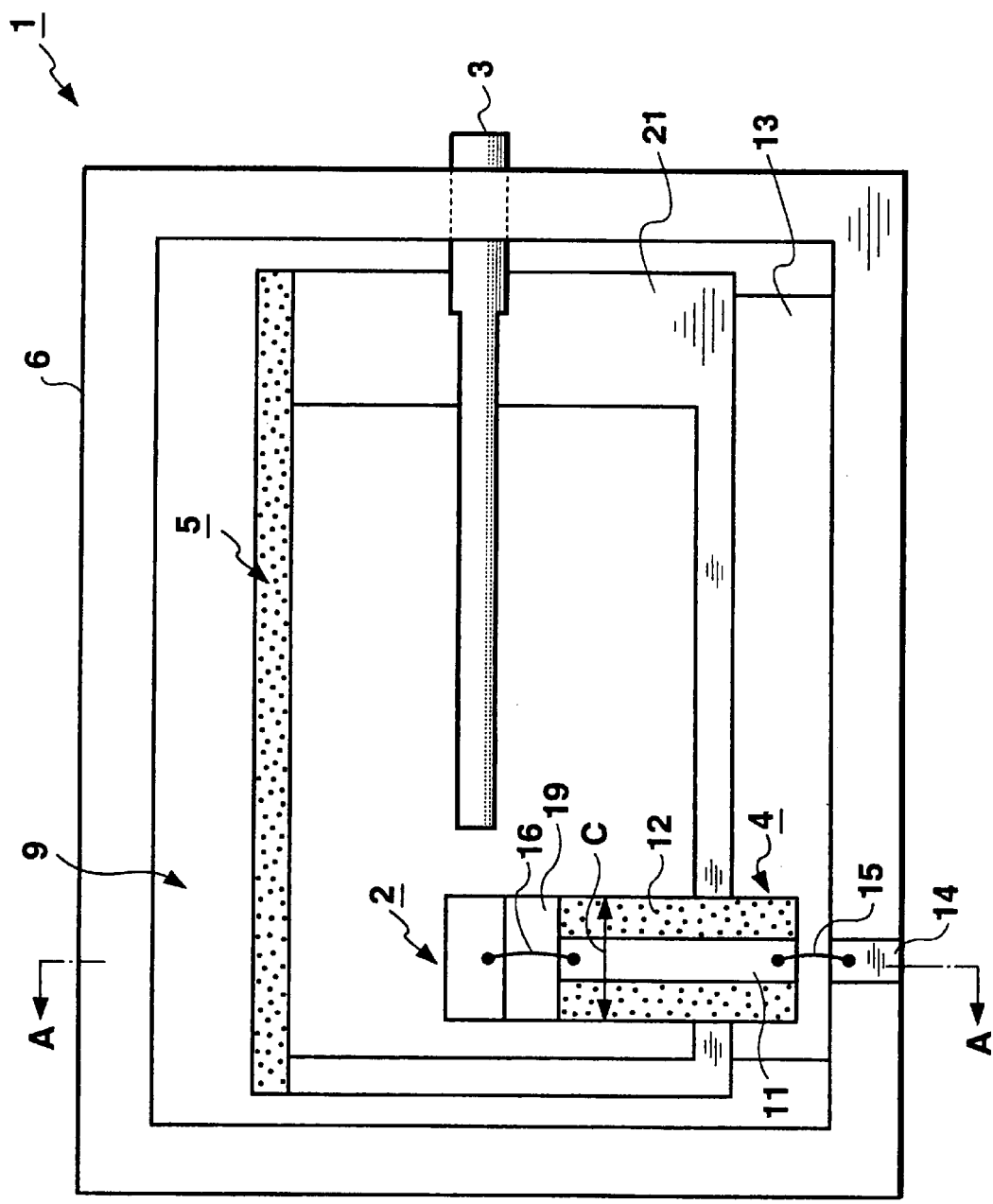
FIG. 1 is a plan view schematically showing a structure of an optical element module 1.
Figure 2:
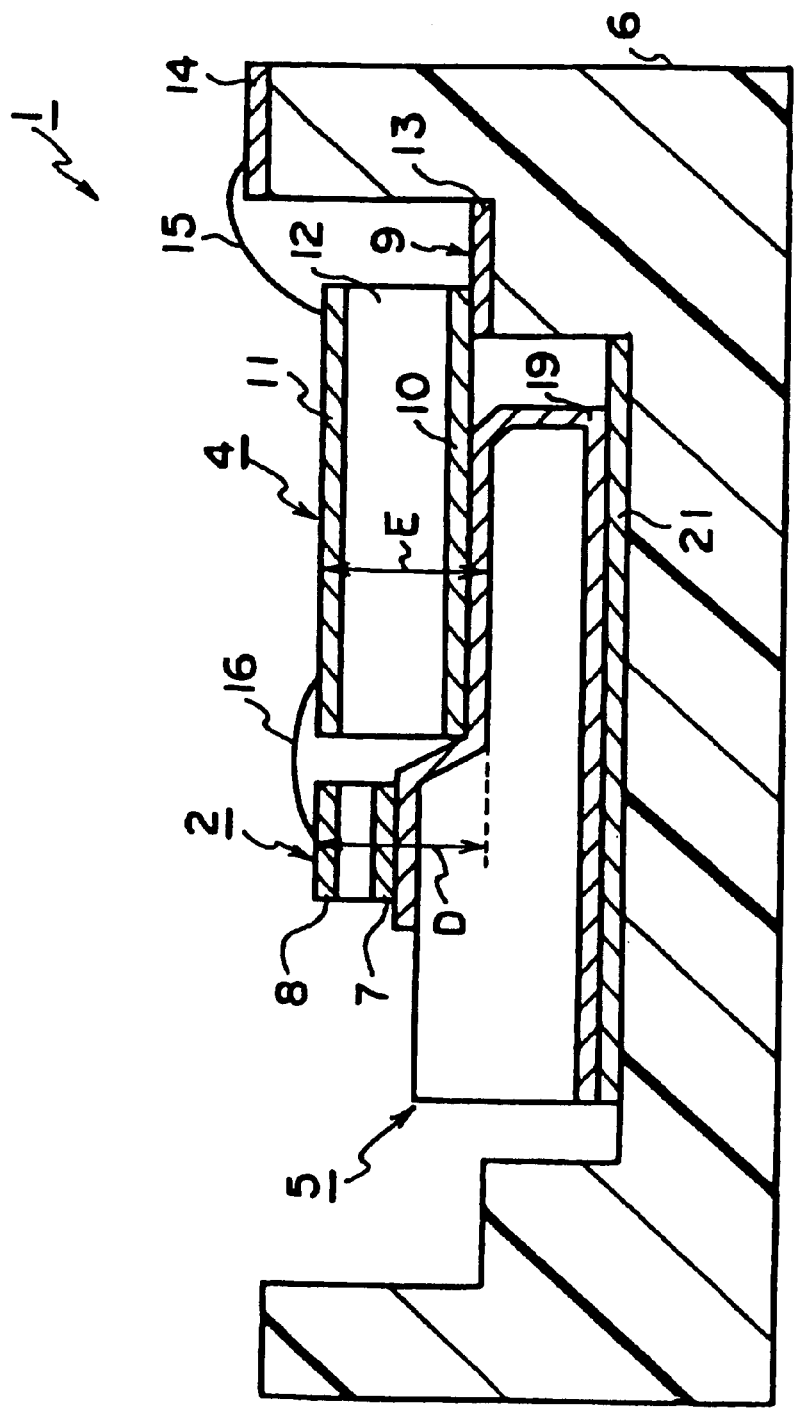
FIG. 2 is a cross sectional view taken along line A—A of FIG. 1.

FIG. 1 is a plan view schematically showing a structure of an optical element module 1, and FIG. 2 is a cross sectional view taken along line A—A of FIG. 1. The optical element module 1 comprises a semiconductor laser (optical element) 2; an optical fiber 3 for propagating with little loss laser light entering from the semiconductor laser 2; a transmission line member 4 which is electrically connected with the semiconductor laser 2; a silicon substrate (mounting substrate) 5 for mounting the optical fiber 3 and the transmission line member 4; and a package (sealing member) 6 for enclosing the semiconductor laser 2, the optical fiber 3, the transmission line member 4, and the silicon substrate 5 when a top opening is sealed with a cover (not shown).

The semiconductor laser 2 comprises an electrode 7 formed on the side of the mounting surface of the silicon substrate 5 and an electrode 8 formed on the opposite side, and oscillates when a high frequency signal is input to the electrode 8, thereby emitting laser light.

The transmission line member 4 is partially mounted on the silicon substrate 5 and is also partially mounted on a convex portion 9 provided on the edge portion at the bottom of the package 6. The transmission line member 4 is constructed as a microstrip line (transmission line) comprising a conductor layer 10 formed to cover substantially the whole surface mounted on the silicon substrate 5, a conductor line 11 formed on the opposite surface, and a dielectric layer 12 sandwiched between the conductor layer 10 and the conductor line 11. The conductor layer 10 is connected with an electrode 13 provided on the convex portion 9 of the package 6 in order to provide a ground potential externally supplied. The conductor line 11 is connected with an electrode 14 disposed on the package 6 via a bonding wire 15, and is also connected with the electrode 8 of the semiconductor laser 2 via a bonding wire (connecting member) 16, so that a high frequency signal externally applied can be input to the electrode 8 of the semiconductor laser 2.

Figure 3:
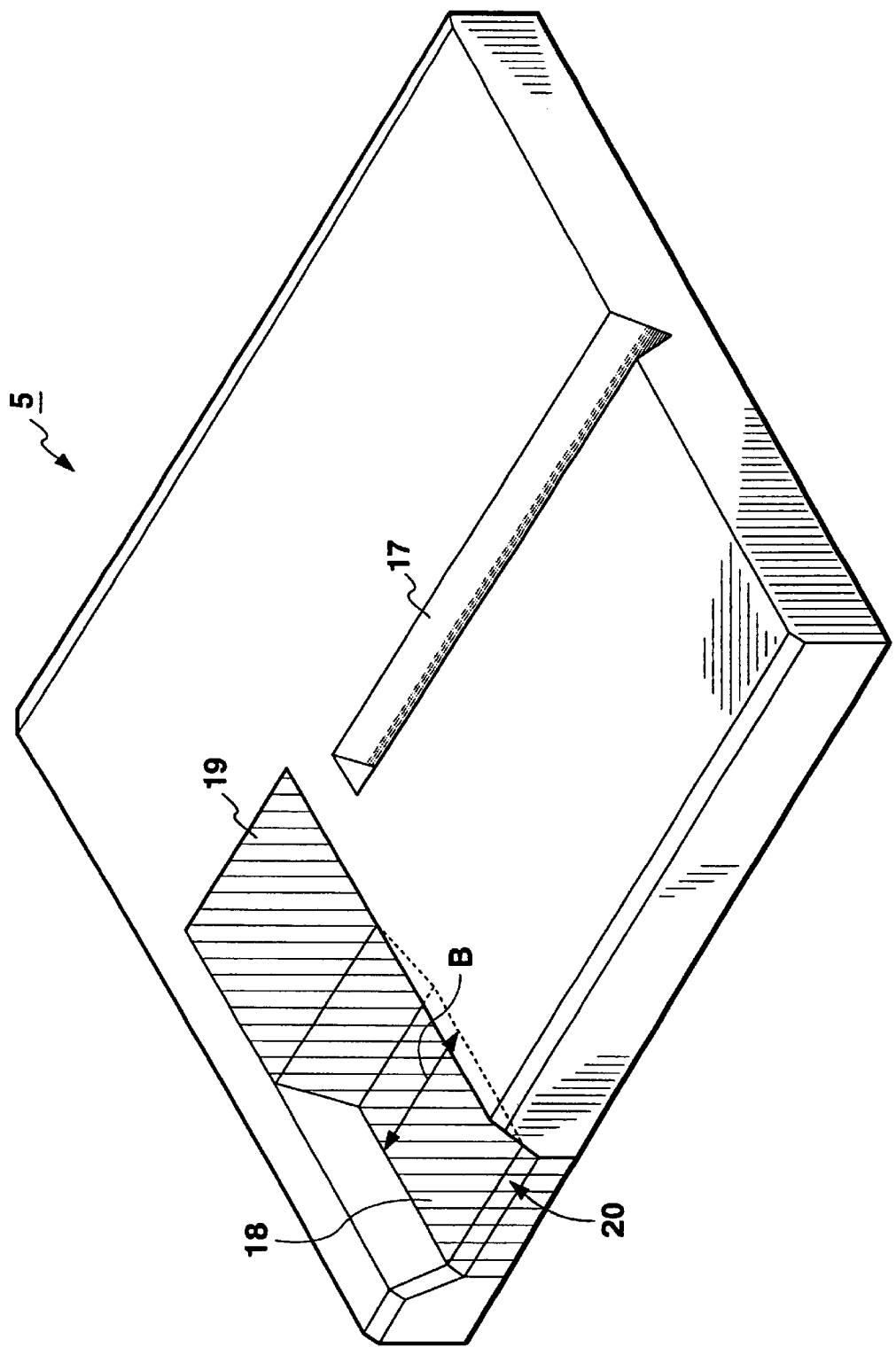
FIG. 3 is a perspective view schematically showing a configuration of a silicon substrate of the optical element module shown in FIGS. 1 and 2.

FIG. 3 is a perspective view schematically showing the structure of the silicon substrate 5. The silicon substrate 5 comprises a V-shaped groove 17 in which the optical fiber 3 is embedded, a groove 18 formed as a cut out portion which is cut from a side of the silicon substrate 5 so as to have a trapezoid cross section, on the bottom of which the transmission line member 4 is mounted, and a bottom electrode 19 extending from a surface portion of the substrate which supports the semiconductor laser 2 to cover the bottom surface of the groove 18, a part of the side surface of the groove 18 and the entire back surface of the silicon substrate 5. The groove 18 is formed on the surface of the silicon substrate 5 having the V-shaped groove 17 by an etching method. The side corner portion 20 of the groove 18 is etched (beveled) to have an angle greater than 900, thereby preventing the bottom electrode 19 from peeling off at the side corner 20. Further, because the groove 18 is formed so that the bottom width B is substantially the same as the width C of the transmission line member 4, the transmission line member 4 can be easily positioned. The groove 18 is also formed so that the distance between the bottom thereof and the top surface of the semiconductor laser 2 (the distance D in FIG. 2) is substantially the same as the distance between the bottom thereof and the top surface of the transmission line member 4 (the distance E in FIG. 2), so that the bonding wire 16 is shorter than that used when these distances are different from each other. This leads to an advantage that inductance components of the bonding wire 16 can be reduced. The bottom electrode 19 is electrically connected with the electrode 7 of the semiconductor laser 2, and is also connected with the conductor layer 10 of the transmission line member 4 and with an electrode 21 formed on the bottom surface of the package 6, so as to supply a ground potential to the electrode 7 of the semiconductor laser 2.

Transmission of a high frequency signal to the semiconductor laser 2 in the optical element module 1 thus configured will be described. A high frequency signal input to the electrode 14 of the package 6 is transmitted, via the bonding wire 15, the transmission line member 4, and the bonding wire 16, to the electrode 8 of the semiconductor laser 2. On the other hand, a ground potential is applied from the electrode 13 to the electrode 7 of the semiconductor laser 2 via the conductor layer 10 and the bottom electrode 19. Since the transmission line member 4 is formed as a microstrip line, the dielectric loss can be reduced beyond the case where an electrode formed directly on the silicon substrate 5 is used as a signal transmission line. As a result, a high frequency signal can be transmitted with a low loss, so that the high frequency characteristics of a signal to be input to the semiconductor laser 2 can be enhanced. Further, on the silicon substrate 5, the bottom electrode 19 is formed so that it extends from a surface portion of the substrate 5 for mounting the semiconductor laser 2 to cover the bottom surface of the groove 18, a part of the side surface of the groove 18 and the whole back surface of the silicon substrate 5, and also a ground potential is supplied to the bottom electrode 19. This reduces a variation of the ground potential, further improving the high frequency characteristics of the input signal.

In the foregoing example, the semiconductor laser 2 is mounted on the silicon substrate 5. However, it is also possible to mount other types of optical elements, such as a light emitting diode, on the silicon substrate 5.

Further, although as described above the groove 18 is formed so as to have a trapezoidal section, the section may have any of various shapes including a rectangular shape, as long as the transmission line member can be mounted on its bottom surface.

Also, although the semiconductor laser 2 or the like is mounted on the silicon substrate 5 in the optical element module 1 of the foregoing example, the substrate is not limited to a silicon substrate, and may be a semiconductor or dielectric substrate as long as it is highly insulative.

Moreover, although in the above example, the transmission line member 4 is formed as a microstrip line in the optical element module 1, the transmission line member may be formed as another type of transmission line such as a coplanar, slot, or coaxial line. The position of each electrode of the semiconductor laser 2 and of each electrode of the package 6 may appropriately be changed so that these electrodes can be electrically connected to the transmission line member 4.

Figure 4:
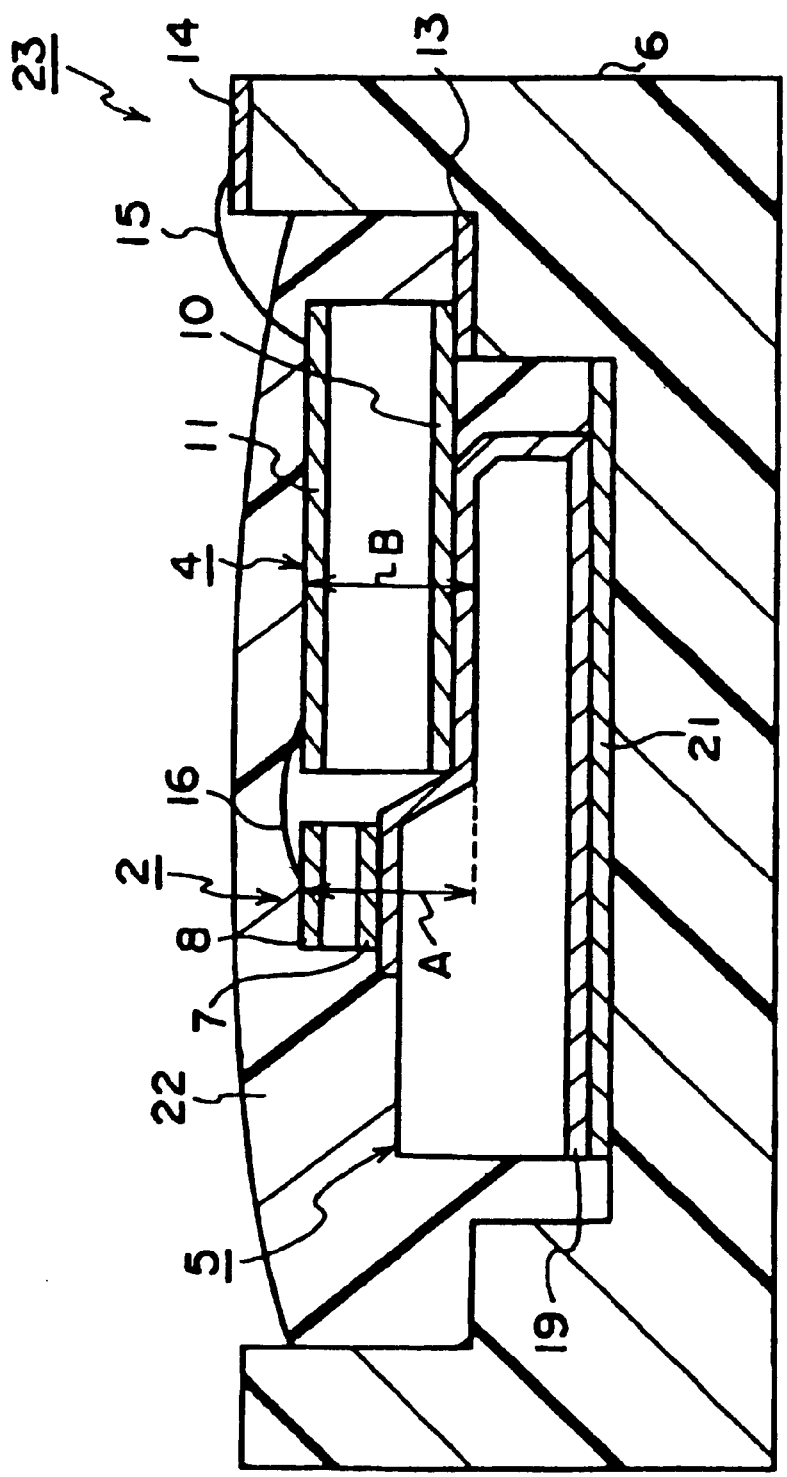
FIG. 4 is a cross sectional view of an optical element module in which a part of the interior is filled with a resin filler to hermetically seal the elements.

FIG. 4 is a cross sectional view showing an optical element module 23 obtained by filling a part of the interior of the optical element module 1 of the first embodiment with a resin filler to hermetically seal the elements. In FIG. 4, elements having the same or similar function with those shown in FIGS. 1 to 3 are designated by the same numerals and will not be described again. The interior of the optical element module 23 is thus hermetically sealed, so that the high frequency characteristics of a signal to be input to the semiconductor laser 2 can be further improved.

Figure 5:
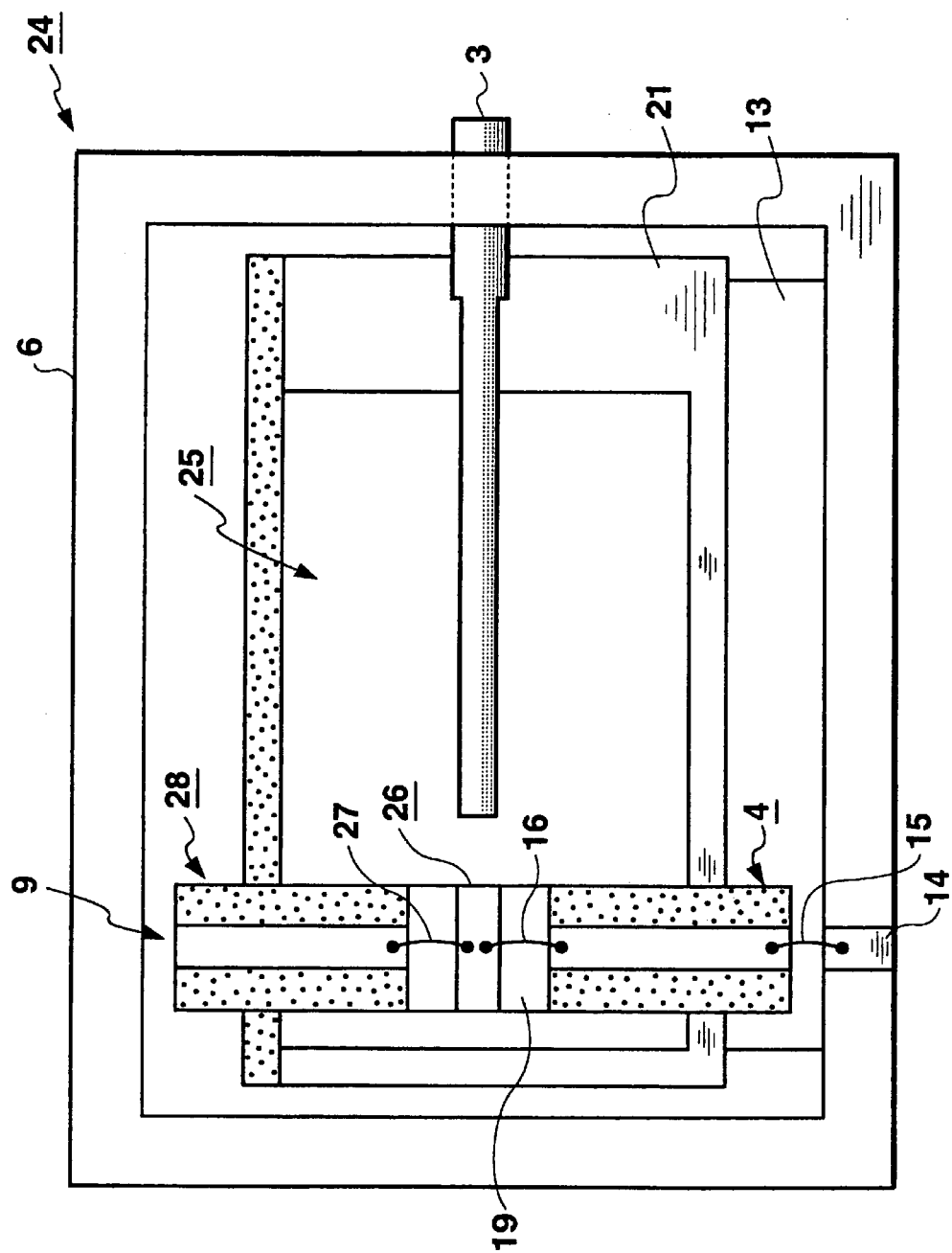
FIG. 5 is a plan view schematically showing a structure of an optical element module comprising two transmission line members.
Figure 6:
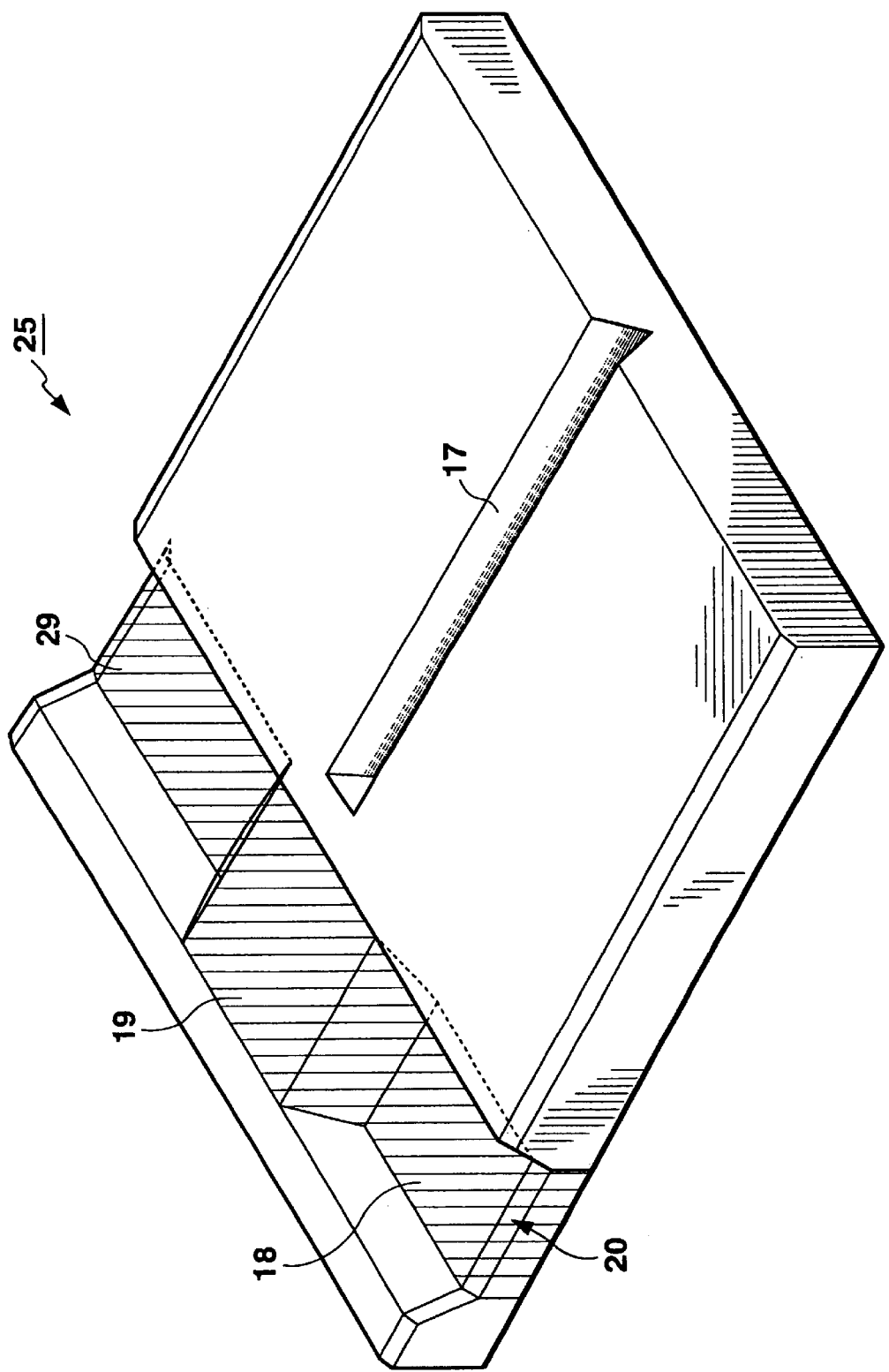
FIG. 6 is a perspective view schematically showing a configuration of a silicon substrate of the optical element module of FIG. 5.

FIG. 5 is a plan view schematically showing the structure of an optical element module 24 comprising two transmission line members, and FIG. 6 is a perspective view schematically showing the structure of a silicon substrate 25 of the optical element module 24. In FIGS. 5 and 6, elements having the same or similar function with those shown in FIGS. 1 to 3 are designated by the same numerals and will not be described again. The optical element module 24 comprises a semiconductor laser 26 comprising a modulator, in which a modulator and a laser device are integrated, and a transmission line member 28 having a structure similar to that of the transmission line member 4. The transmission line member 28 is connected with the semiconductor laser 26 via a bonding wire 27, and terminates an input of the modulator at 50Ω. The silicon substrate 25 has a groove 29 which is of a shape similar to that of the groove 18 and is provided with a bottom electrode which is similar to that of the groove 18. The transmission line member 28 is mounted on the bottom surface of the groove 29. In the optical element module 24, it is also possible to improve the high frequency characteristics of a signal to be input to the semiconductor laser 26 comprising a modulator.

While the preferred embodiment of the present invention has been described using specific terms, such description is for illustrative purposes only, and it is to be understood that changes and variations may be made without departing from the spirit or scope of the appended claims.

What is claimed is:

1. An optical element module comprising:
   an optical element;
   a mounting substrate composed of a semiconductor or dielectric material and supporting said optical element on a top surface; and
   a transmission line member at least partially mounted on the top surface of said mounting substrate and electrically connected with said optical element.

2. An optical element module according to claim 1, wherein
   said mounting substrate has a groove on the top surface, and
   at least part of said transmission line member is mounted on a bottom surface of said groove.

3. An optical element module according to claim 2, wherein said groove is formed as a hole in a side of said mounting substrate.

4. An optical element module according to claim 2, wherein said groove is formed such that the height of said optical element at a top surface is substantially the same as the height of said transmission line member at a top surface.

5. An optical element module according to claim 4, further comprising a connecting member for electrically and physically connecting said optical element and said transmission line member on the side of the top surface of said optical element.

6. An optical element module according to claim 2, wherein said groove is formed such that the bottom surface thereof and said transmission line member are of substantially the same width.

7. An optical element module according to claim 2, wherein said mounting substrate is provided with a bottom electrode formed on the bottom surface of said groove.

8. An optical element module according to claim 7, wherein said transmission line member comprises:
   a conductor layer formed on substantially the whole back surface of said transmission line member for supplying a ground potential to said optical element via said bottom electrode, and
   a conductor line formed on the top surface of said transmission line member for transmitting a signal to said optical element.

9. An optical element module according to claim 2, wherein said mounting substrate is provided with a bottom electrode extending through the back surface and a side surface of said mounting substrate to the bottom surface of said groove.

10. An optical element module according to claim 9, wherein a side corner portion of said groove is etched beveled.

11. An optical element module according to claim 1, further comprising a resin sealing member for sealing said optical element, said mounting substrate, and said transmission line member.

12. An optical element module according to claim 1, wherein said optical element is a semiconductor laser.

13. An optical element module according to claim 1, wherein said optical element is a semiconductor laser comprising a modulator.

14. An optical element module according to claim 1, wherein said mounting substrate is made of silicon.

15. An optical element module according to claim 1, comprising an optical fiber receiving light emitted from said optical element.

16. An optical element module according to claim 1, comprising an optical fiber which is mounted on a V-shaped groove formed on the top surface of said mounting substrate and receives light emitted from said optical element.

17. An optical element module, comprising:
   an optical element;
   a mounting substrate composed of a semiconductor or dielectric material and supporting said optical element on a top surface, said mounting substrate having a plurality of grooves formed on said top surface; and
   a plurality of transmission line members at least partially mounted on a bottom surface of any of said plurality of grooves and electrically connected with said optical element.

* * * * *